United States Patent [19]

McKinnon et al.

[11] Patent Number: 5,243,285
[45] Date of Patent: Sep. 7, 1993

[54] METHOD AND ARRANGEMENT FOR TWO-DIMENSIONAL NUCLEAR MAGNETIC RESONANCE SPECTROSCOPY

[75] Inventors: Graeme McKinnon, Zürich; Peter Bösiger, Ennetbaden, both of Switzerland

[73] Assignee: U.S. Philips Corp., New York, N.Y.

[21] Appl. No.: 744,628

[22] Filed: Aug. 13, 1991

[30] Foreign Application Priority Data

Aug. 29, 1990 [DE] Fed. Rep. of Germany ....... 4027252

[51] Int. Cl.$^5$ .............................................. G01R 33/20
[52] U.S. Cl. .................................... 324/309; 324/307
[58] Field of Search ............... 324/309, 307, 312, 311, 324/313, 314

[56] References Cited

U.S. PATENT DOCUMENTS

| 4,771,242 | 9/1988 | Lampman et al. | 324/309 |
| 4,789,832 | 12/1988 | Nagayama | 324/312 |
| 4,823,084 | 4/1989 | McKinnon | 324/309 |
| 4,862,083 | 8/1989 | McKinnon et al. | 324/309 |
| 4,868,503 | 9/1989 | McKinnon et al. | 324/304 |
| 4,918,387 | 4/1990 | McKinnon et al. | 324/309 |
| 5,027,072 | 6/1991 | Rinaldi | 324/307 |
| 5,049,820 | 9/1991 | Briand | 324/309 |
| 5,111,143 | 5/1992 | McKinnon et al. | 324/309 |

OTHER PUBLICATIONS

G. C. McKinnon & P. Bosiger, "Localized Double-Quantum Filter and Correlation Spectroscopy Experiments", Magnetic Resonance in Medicine, vol. 6, (1988), pp. 334-343.
Springer-Verlag, "Modern Techniques in High-Resolution FT-NMR", Book of Chandrakumar/Subramanian, pp. 177-181.

Primary Examiner—Michael J. Tokar
Assistant Examiner—Raymond Y. Mah
Attorney, Agent, or Firm—Jack D. Slobod

[57] ABSTRACT

Two-dimensional nuclear magnetic resonance spectroscopy with a frequently repeated sequence comprises four high-frequency pulses and acting together with a homogeneous stationary magnetic field upon an examination area, which sequence contains two 180° pulses, halfway between which a third pulse is located. The pulse of the sequence are preceded by a first pulse, whose distance from the second pulse, which is equal to or larger than the relative distance of the other pulses, is varied during the repetition of the sequence. This method is particularly suitable for in vivo examinations of the human body in that during three of the four pulses magnetic gradient fields are operative, whose gradients extend mutually perpendicular to each other, and before and after the third high-frequency pulse a magnetic gradient field is operative having such a duration and such a gradient that the time integral across this field has the same value before the third pulse as after the third pulse.

15 Claims, 3 Drawing Sheets

METHOD AND ARRANGEMENT FOR TWO-DIMENSIONAL NUCLEAR MAGNETIC RESONANCE SPECTROSCOPY

FIELD OF THE INVENTION

The invention relates to a method and arrangement for two-dimensional nuclear magnetic resonance spectroscopy with a frequently repeated sequence of four pulses that act together with a homogeneous stationary magnetic field upon an examination area, which sequence comprises two 180° pulses, halfway between which a third pulse is present and which are preceded by a first pulse, whose distance from the second pulse, which is equal to or larger than the distance between the remaining pulses, is varied during the repetition of the sequence.

BACKGROUND OF THE INVENTION

Such a method is known under the designation of "Super-COSY" and is described inter alia in the book of Chandrakumar/Subramanian "Modern Techniques in High Resolution FT NMR", Springer-Verlag, pages 177–181. According to FIG. 4.41 of this publication, the first and third pulses are 90° pulses, which, like the two 180° pulses, are coherent in phase; therefore, during these pulses the carrier oscillation of the high-frequency magnetic field has a defined phase position. The nuclear magnetic resonance signal, which develops after an instant which has the same time distance from the second 180° pulse as the latter has from the third pulse, is transposed to the low-frequency range, is digitized and is stored. During the further repetitions of this sequence, the distance between the first high-frequency pulse and the first 180° pulse is varied.

The nuclear magnetic resonance signals then obtained constitute a two-dimensional set of data, whose data depend upon the time distance of the relevant sample value from the second 180° pulse and on the time distance between the two first high-frequency pulses. If through each of these variables—each time diminished by the distance of the third pulse from one of the two 180° pulses—a Fourier transformation is carried out, a two-dimensional spectrum is obtained, in which the frequency lines of two molecule groups coupled to each other appear on a diagonal line (diagonal peaks) and appear symmetrically to this diagonal (cross-peaks).

By means of this method, various of the amino acids also present in the human body, such as, for example, the glutamates, glutamin, taurins and the inosites, can be demonstrated by small concentrations—but only in vitro. In examinations in vivo at the human body, additional difficulties are met, because as a rule only the spectrum of a subvolume of the examination area is of importance (localized spectroscopy) and because moreover at the examination area protons bound to water are present, whose concentration is several powers of tens higher than the concentration of the protons in the relevant amino acids.

From the magazine "Magnetic Resonance in Medicine", 6, pp. 334–343 (1988), a method for the localized correlation spectroscopy (COSY) is known, in which in a sequence after two 90° pulses, whose relative distance is varied, three 180° pulses are produced at a fixed distance from the second pulse, which are accompanied by magnetic gradient fields, whose gradients extend at right angles to each other. The echo signal is then processed. This "adhesion" of the three layer-selective 180° pulses to the actual "COSY" sequence has the disadvantage that the time from the first excitation pulse to the sampling of the nuclear magnetic resonance signal is considerably lengthened so that the amplitude thereof is considerably reduced inter alia due to relaxation effects. More particularly, the method cannot be used for proton spectroscopy in vivo because the water suppression is not sufficient.

SUMMARY OF THE INVENTION

The present invention has for its object such that it can be used for examinations in vivo. According to the invention, this object is achieved in that during three of the four pulses magnetic gradient fields are operative, whose gradients extend mutually perpendicular to each other, in that before and after the third high-frequency pulse a magnetic gradient field is operative having such a duration and such a gradient that the time integral across these gradients has before the third pulse the same value as after the third pulse.

According to the invention, therefore, three of the four high-frequency pulses are accompanied by gradients mutually perpendicular to each other. As a result, for these three layer-selective pulses a location-dependent phase position is obtained so that any phase coherence is disturbed. In fact the invention is based on the recognition that such a phase coherence is not required for the super-COSY method.

For components whose nuclear magnetization has already been influenced by the first pulse, and by the succeeding 180° pulse the magnetic gradient field is practically inoperative before and after the third pulse; inter alia the amino acids to be demonstrated belong to these components. On the contrary, the components whose nuclear magnetization is excited for the first time by the third pulse necessarily of large bandwidth—when the method is suitably carried out, the protons bound to water belong to these components—only the magnetic gradient field is operative after this pulse so that they are dephased thereby and their contribution to the resulting nuclear magnetic resonance signal disappears.

A preferred further embodiment of the invention is characterized in that the first high-frequency pulse is a frequency-selective pulse, which is not accompanied by a gradient field and does not excite the nuclear magnetization of the protons bound to water, but excites the nuclear magnetization of the protons bound to the compounds to be demonstrated, and in that before, during and after the third high-frequency pulse at least one magnetic gradient field is operative having such a gradient and such a duration that the time integral across this gradient is exactly equally large in the time interval terminating at the center of the third pulse as in the time interval beginning at the center of the third pulse. In this case, the nuclear magnetization of the protons bound to water is excited neither by the first pulse nor by the succeeding 180° pulse so that in conjunction with the gradient fields a water suppression is obtained in all before and after the third pulse.

A further embodiment of the invention is characterized in that before and after the two 180° high-frequency pulses a magnetic gradient field is operative having such a gradient and such a duration that the time integral across this field is being equally large before and after the relevant pulses. By the gradient fields being operative before and after the two 180° pulses, the whole nuclear magnetization outside the selected subvolume is (additionally) dephased and the nuclear magnetization is dephased which can be excited by these two pulses if there so-called flip angle is not exactly 180°.

BRIEF DESCRIPTION OF THE DRAWING

In order that the invention may be readily carried out, it will now be described more fully, by way of example, with reference to the accompanying drawing, in which.

DESCRIPTION OF THE PREFERRED EMBODIMENT

Figure 1:
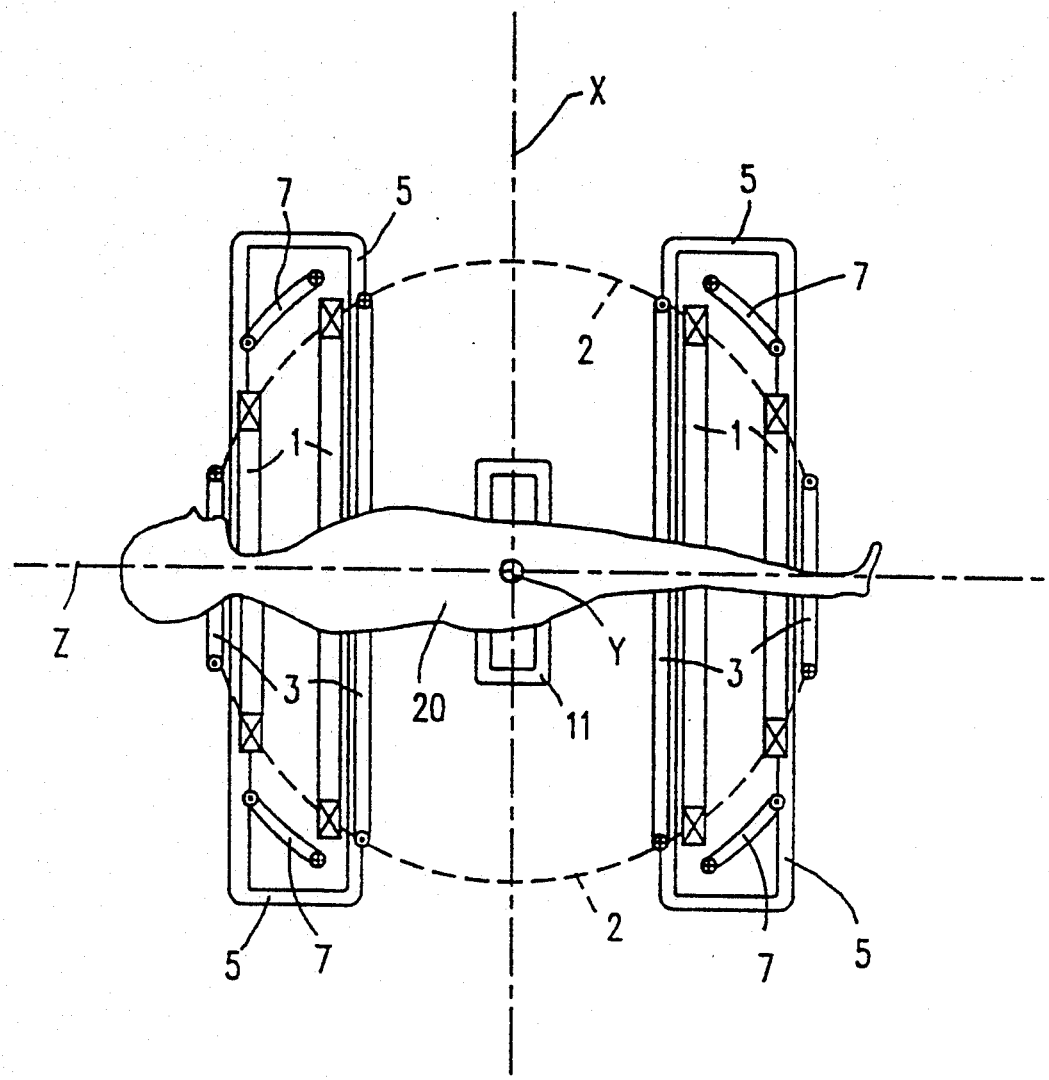
FIG. 1 shows an apparatus for medical nuclear magnetic resonance examinations, by means of which the method according to the invention can be carried out.

The nuclear magnetic resonance examination apparatus shown diagrammatically in FIG. 1 comprises an arrangement consisting of four coils 1 for producing a homogeneous stationary magnetic field, which may be of the order of a few tenths of T to a few T. This field is directed in the z direction of a Cartesian coordinate system. The coils arranged concentrically to the z axis can be provided on a spherical surface 2. The patient 20 to be examined is located within the interior of these coils.

For producing a magnetic field Gz extending in the z direction and varying linearly in this direction, four coils 3 are preferably arranged on the same spherical surface. Further, four coils 7 are provided, which produce a magnetic gradient field Gx also extending in the z direction (i.e. a magnetic field whose strength varies linearly in one direction), whose gradient extends in the x direction, however. A magnetic gradient field Gy extending in the z direction and having a gradient in the y direction is produced by four coils 5, which may be of the same shape as the coils 7, which, however, are relatively offset with respect to the latter by 90°. Of these four coils, only two are shown in FIG. 1.

Since each of the three coil arrangements 3, 5 and 7 for producing the magnetic gradient fields Gz, Gy and Gx is arranged symmetrically to the spherical surface 2, the field strength at the center of the sphere, which at the same time constitutes the coordinate origin of the Cartesian xyz coordinate system, is determined only by the stationary homogeneous magnetic field of the coil arrangement 1. Further, a high-frequency coil 11 is arranged symmetrically to the plane z=0 of the coordinate system, which is formed so that a substantially homogeneous high-frequency magnetic field is produced thereby, which extends in the x direction, i.e. at right angles to the direction of the stationary homogeneous magnetic field. A high-frequency modulated current is supplied by a high-frequency generator to the high-frequency coil during each high-frequency pulse. After a sequence the high-frequency coil 11 or a separate high-frequency reception coil serves to receive the nuclear magnetic resonance signals produced at the examination area.

Figure 2:
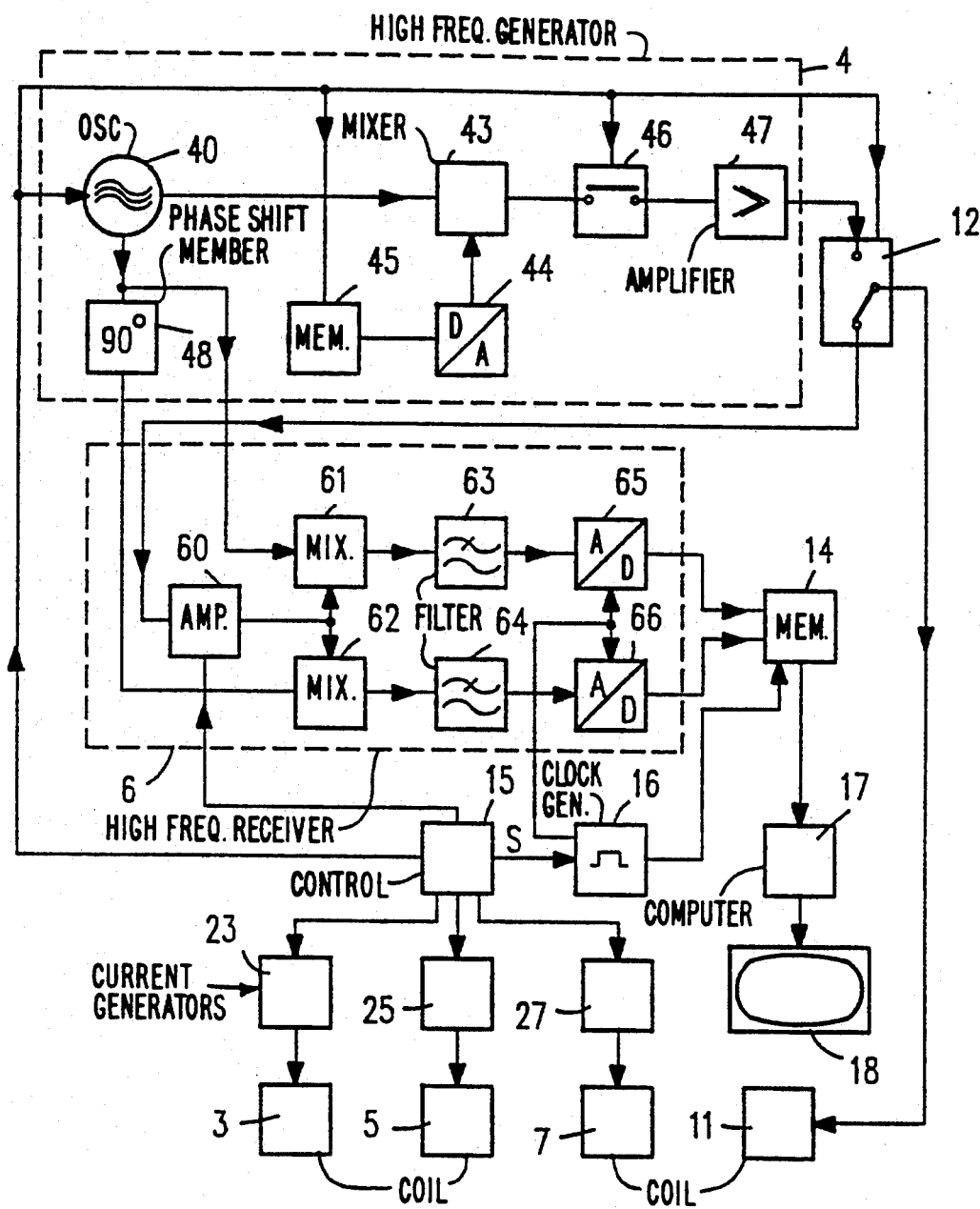
FIG. 2 shows a block circuit diagram of such an apparatus.

FIG. 2 shows a simplified block circuit diagram of this nuclear magnetic resonance examination apparatus. The high-frequency coil 11 is connected through a change-over device 12 to a high-frequency generator 4 and to a high-frequency receiver 6.

The high-frequency generator 4 comprises a high-frequency oscillator 40, whose frequency can be digitally controlled by a control unit 15 and which supplies oscillations at a frequency corresponding to the Larmor frequency of the atomic nuclei to be excited at the field strength produced by the coils 1. The Larmor frequency f can be calculated, as is known, according to the relation: $f = cB$, where B is the magnetic induction in the stationary homogeneous magnetic field and c is the gyromagnetic ratio, which is, for example, for protons 42.56 MHz/T. The output of the oscillator 40 is connected to an input of a mixer stage 43. A second input signal is supplied to the mixer stage from a digital-to-analogue converter 44, whose output is connected to a digital memory 45. From the memory, a sequence of digital data words representing an envelope signal is read—under the control of the control device.

The mixer stage 43 processes the input signals supplied to it in such a manner that the carrier oscillation modulated by the envelope signal appears at its output. The output signal of the mixer stage 43 is supplied through a switch 46 controlled by the control device 15 to a high-frequency power amplifier 47, whose output is connected to the change-over device 12. The latter is also controlled by the control device 15.

The receiver 6 comprises a high-frequency amplifier 60, which is connected to the change-over device 12 and to which the nuclear magnetic resonance signals induced in the high-frequency coil 11 are supplied, while the change-over device must have the corresponding switching state. The amplifier 60 has a muting input, which is controlled by the control device 15 and through which it can be cut off so that the amplification is practically zero. The output of the amplifier is connected to the first inputs of two multiplicative mixer stages 61 and 62, each of which supply an output signal corresponding to the product of their input signals. A signal having the frequency of the oscillator 40 is supplied to the second inputs of the mixer stages 61 and 62, while between the signals at the two inputs a phase shift of 90° occurs. This phase shift is produced by means of a 90° phase shift member 48, whose output is connected to the input of the mixer stage 62 and whose input is connected to the input of the mixer stage 61 and to the output of the oscillator 40.

The output signals of the mixer stages 61 and 62 are each supplied through low-pass filters 63 and 64, which suppress the frequency supplied by the oscillator 40 and all the frequencies exceeding this frequency and transmit low-frequency components, to an analogue-to-digital converter 65 and 66, respectively. The latter converts the analogue signals of the circuit arrangement 61 . . . 64 constituting a quadrature demodulator into digital data words, which are supplied to a memory 14. The analogue-to-digital converters 65 and 66 as well as the memory 14 receive their clock pulses from a clock pulse generator 16, which can be blocked and released, respectively, through a control lead by the control device 15, so that the signals supplied by the high-frequency coil 11 and transposed to the low-frequency range can be converted into a sequence of digital data words and can be stored in the memory 14 only in a measuring interval defined by the control device 15.

The data words stored in the memory 14 are supplied to a computer 17, which determines therefrom by a twofold discrete Fourier transformation the two-dimensional spectrum of the nuclear magnetization and supplies it to a suitable display unit, for example a monitor 18.

The coil arrangements 3, 5 and 7 for producing the magnetic gradient fields Gz, Gy and Gx, respectively, are supplied by current generators 23, 25 and 27 in each case with a current whose temporal variation can be controlled by the control unit 15.

Figure 3:
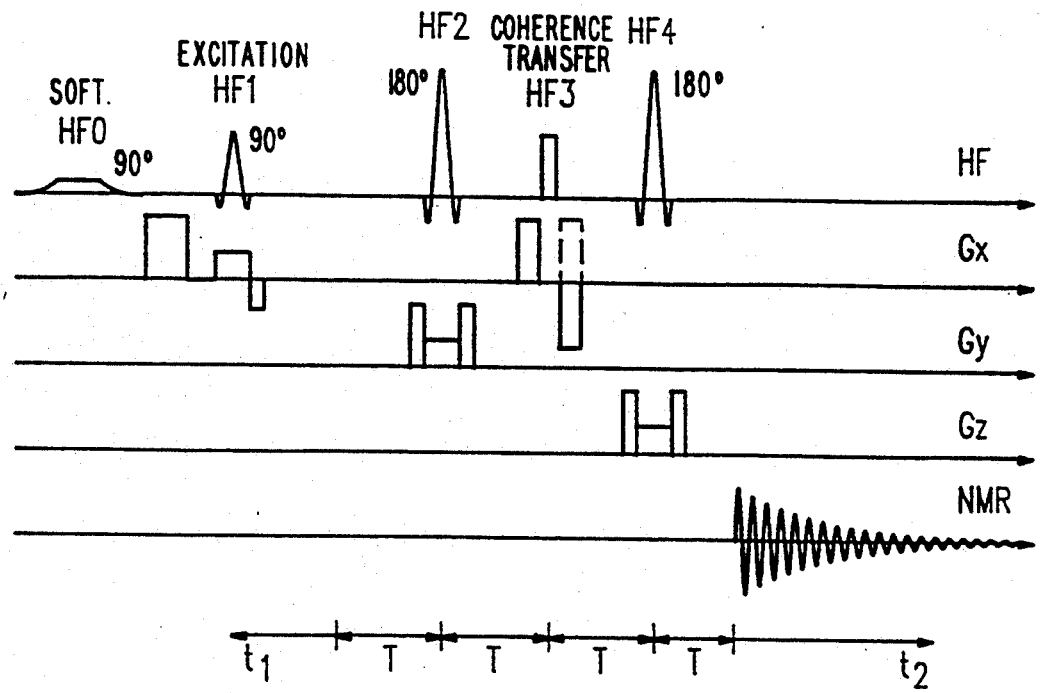
FIG. 3 shows the time position of the high-frequency pulses and of the magnetic gradient fields in a first embodiment of a sequence according to the invention.
Figure 4:
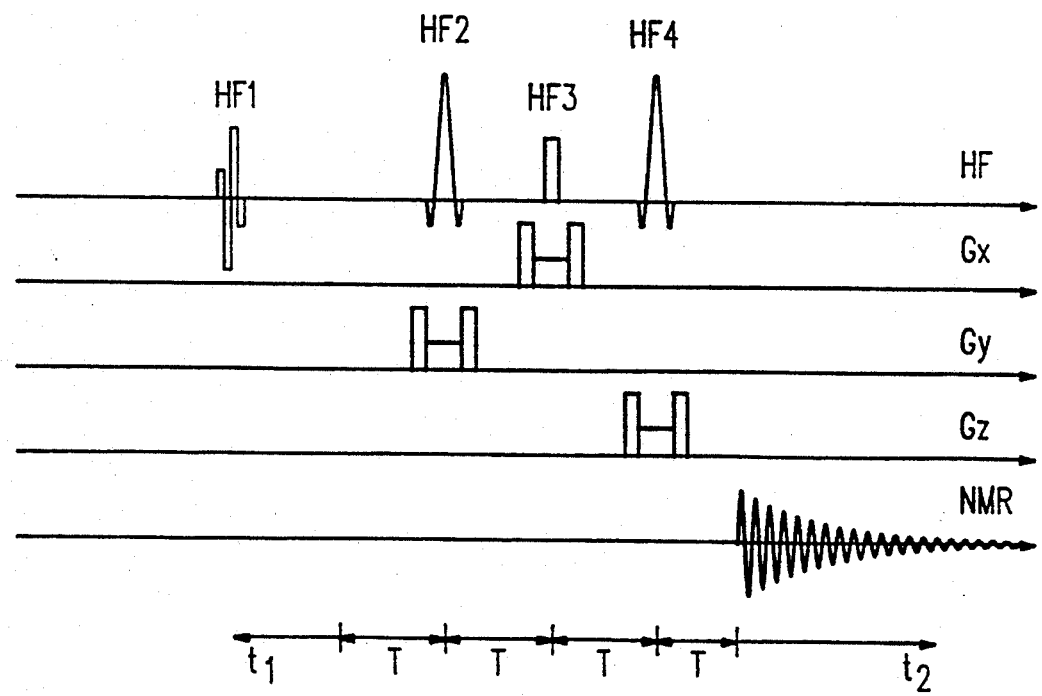
FIG. 4 shows the variation with time in a second preferred embodiment.

In FIGS. 3 and 4, the first line thereof shows the time position of the four high-frequency pulses HF1 . . . HF4 of the super-COSY sequence. The first pulse HF1 of the high-frequency magnetic field, which is designated as excitation pulse, is a 90° pulse. The same applies to the third high-frequency pulse HF3, which is also designated as coherence transfer pulse. This coherence transfer pulse is a "hard" pulse, i.e. a pulse of large bandwidth, which influences not only the nuclear magnetization of the protons bound to one of the amino acids to be demonstrated, but also the nuclear magnetization of the protons bound to water. The second and fourth pulses HF2 and HF4, respectively, are 180° pulses. The third high-frequency pulse HF3 is located accurately halfway between these two pulses so that the three last pulses have a relative time distance T. T can be $\frac{1}{4}$ J, where J is the scalar coupling constant (about 7 Hz), but may also be even shorter, especially for complex molecule structures.

The instant at which the sampling of the resonance signal begins (fifth line of FIG. 3 and FIG. 4, respectively) is also at the distance T from the center of the fourth high-frequency pulse HF4. The time position of a sample value—related to the said sampling instant—is designated by $t_2$. The time distance of the first pulse HF1 from the second pulse HF2 is larger than the time distance between the three last pulses HF2 . . . HF4 and is $t_1+T$. During the repetitions of the sequence, this distance is varied. The individual sample values of the nuclear magnetic resonance signals recorded during these repetitions constitute a two-dimensional set of data, which depends upon the variables $t_1$ and $t_2$. A double Fourier transformation with respect to these parameters yields the desired frequency spectrum.

In the embodiment of the sequence shown in FIG. 3, the first pulse HF1 is preceded by an initial pulse HF0, which is a "soft" 90° pulse, i.e. a pulse of small bandwidth, which is exactly tuned to the Larmor frequency of the protons bound to water. The latter therefore excites the nuclear magnetization of the protons bound to water, but does not excite that of the protons bound to the amino acids. The nuclear magnetization excited in this manner is dephased by a magnetic gradient field—Gx—and therefore practically does not influence the nuclear magnetic resonance signal developing after the fourth pulse HF4.

The first (HF1), the second (HF2) and the fourth (HF4) pulses in the sequence shown in FIG. 3 are layer-selective pulses, which influence the nuclear magnetization in three layers at right angles to each other; the area of these three layers defines the subvolume, which is evaluated spectroscopically. The layer selection at HF1, HF2 and HF4 is effected in that during these three pulses magnetic gradient fields are operative having gradients at right angles to each other, for example Gx, Gy, Gz.

In addition, the magnetic gradient fields assigned to the pulses HF2 and HF4 are operative before and after these pulses preferably with an increased gradient in such a manner that the time integral across these gradient fields is exactly equally large before the pulse as after the pulse. As a result, the nuclear magnetization in the part located outside the selected subvolume of the examination area is still further dephased and in addition the components are suppressed, which can be obtained in that HF2 and HF4 in the selected subvolume are not exactly operative as 180° pulses.

Before and after the third high-frequency pulses, also a magnetic gradient field (Gx) is switched on and off with such a variation with time that the time integral across this gradient field has exactly the same value before the pulse as after the pulse, while according to the second line of FIG. 3 the sign of the gradient changes (full lines in line 2). With the variation with time of HF3 shown, the position-dependent dephasing, to which the nuclear magnetization of the magnetic gradient field influenced by the pulses HF1 and HF2 is subjected before the coherence transfer pulse HF3, is compensated by the rephasing starting after HF3. However, this gradient field has a dephasing effect on the nuclear magnetization—of, for example, water—excited for the first time by the coherence transfer pulse HF3 of large band-width as far as it has not been fully dephased already by HF0 because this gradient field can act upon it only after HF3.

At the same time, the spectrum is made unambiguous by the gradient field Gx before and after the coherence transfer pulse HF3 in that reflections are suppressed. In fact, without these gradients otherwise the spectrum would contain not only peaks on a diagonal line (diagonal peaks) and beside this line, but also peaks on a diagonal line perpendicular thereto, which intersects the aforementioned diagonal line at the zero point of the frequency spectrum. The gradient field Gx before and after HF3 therefore suppresses one of these "reflections".

It is not required that the gradients Gx before and after the third high-frequency pulse HF3 have opposite signs; it is only essential that the time integrals across these gradients are equal to each other before and after the coherence transfer pulse HF3. Therefore, these gradients may also have the same sign—as is indicated in FIG. 3 by broken lines showing the gradient following HF3. Only the other of the two "reflections" of the two-dimensional frequency spectrum is suppressed.

In the preferred embodiment of a sequence for the localized two-dimensional protonspectroscopy shown in FIG. 4, the three last pulses HF2 . . . HF4 are layer-selective pulses, while the first pulse HF1 is not layer-selective and is preferably a frequency-selective pulse, whose frequency spectrum disappears at the Larmor frequency of the protons bound to water and has a maximum at the Larmor frequency of the amino acids to be demonstrated. Preferably, a binominal ($1\bar{3}3\bar{1}$) pulse is concerned, which consists of four subpulses, the frequency of the carrier oscillation operative within the subpulses and the time distance of the subpulses being chosen correspondingly. Since therefore HF1 does not excite the nuclear magnetization of the protons bound to water, it is not required to choose for water suppression, as in the sequence of FIG. 3, a high-frequency pulse as foremost pulse, which excites the nuclear magnetization of these protons in order then to dephase the latter by means of a magnetic field.

The time variation of the magnetic gradient field Gy and Gz, respectively, before, during and after the second and the fourth pulse HF2 and HF4, respectively, is the same as in the sequence of FIG. 3; however, in this case a magnetic gradient field Gx is operative not only before and after the pulse HF3, but also during this pulse, as a result of which a layer is defined, whose thickness depends upon the band-width and upon the value of the gradient. The time integrals across the gradients before and after the pulse HF3 then must have not only the same value, but also the same sign; opposite signs of these integrals—as in the sequence of FIG. 3—are not possible.

As already stated, the magnetic gradient field Gx operative before and after the coherence transfer pulse HF3 brings about a dephasing of the nuclear magnetization excited for the first time by this pulse and a suppression of one of the two frequency spectra arranged as images one of the other. However, the same result may also be attained by the phase cycling usual in conjunction with the COSY or super COSY method, in which—the other parameters of the sequence being the same—the phase position of the coherence transfer pulse—related to the phase position with the first pulse—can be changed by 90° and the nuclear magnetic resonance signals can be added or subtracted. Both possibilities (gradient field before and after the coherence transfer pulse and phase cycling) may also be used in combination.

What is claimed is:

1. A method for two-dimensional magnetic resonance spectroscopy comprising repeatedly applying a sequence comprising four high-frequency magnetic field pulses to an examination area in the presence of a homogeneous stationary magnetic field, receiving magnetic resonance signals produced in the examination area in response to each sequence, and determining spectra from the received spin resonance signals, said sequence comprising a first high-frequency pulse (HF1), a second 180° high-frequency pulse (HF2) which occurs a first time interval after said first high-frequency pulse (HF1), which first time interval is varied from one repetition of the sequence to another, a third coherence transfer high-frequency pulse (HF3) which occurs a second time interval after the second high-frequency pulse (HF2), said second time interval having a duration (T) less than or equal to a duration (t₁+T) of the first time interval, and a fourth 180° high-frequency pulse (HF4) which occurs a third time interval after the third high-frequency pulse (HF3), said third time interval having a duration (T) which is equal to the duration (T) of the second time interval, wherein three of said four high-frequency pulses are accompanied by different magnetic gradient fields which are applied to said examination area in respective different directions which are mutually perpendicular to each other, and wherein a magnetic gradient field is applied during respective durations of time prior to and after said third high-frequency pulse such that integrals of the latter magnetic gradient field over said respective durations of time have equal absolute values.

2. A method as claimed in claim 1, wherein said method is for demonstrating certain one or more compounds to which protons are bound, and wherein said first high-frequency pulse (HF1) is a frequency-selective pulse unaccompanied by a magnetic gradient field which excites a nuclear magnetization of protons bound to the compounds to be demonstrated without exciting a nuclear magnetization of protons bound to water.

3. A method as claimed in claim 1, wherein said method is for demonstrating certain one or more compounds to which protons are bound, and wherein the three of said four high-frequency pulses accompanied by respective magnetic gradient fields include said first high-frequency pulse (HF1) and said third high-frequency pulse, said sequence further comprises an initial frequency-selective high-frequency pulse which precedes said first high-frequency pulse, said initial high-frequency pulse exciting only a nuclear magnetization of protons bound to water, and for at least a part of an initial time interval between the initial high-frequency pulse (HF0) and said first high-frequency pulse (HF1) a magnetic gradient field is applied for dephasing the excited nuclear magnetization of protons bound to water.

4. A method as claimed in claim 1, wherein a magnetic gradient field is applied during respective durations of time immediately prior to and immediately after said second high-frequency pulse (HF2) such that integrals of the latter magnetic gradient field over said respective durations have equal absolute values.

5. A method as claimed in claim 1, wherein a magnetic gradient field is applied during respective durations of time immediately prior to and immediately after said fourth high-frequency pulse (HF4) such that integrals of the latter magnetic gradient field over said respective durations have equal absolute values.

6. A method as claimed in claim 4, wherein a magnetic gradient field is applied during respective durations of time immediately prior to and immediately after said fourth high-frequency pulse (HF4) such that integrals of the latter magnetic gradient field over said respective durations have equal absolute values.

7. A method as claimed in claim 2, wherein a magnetic gradient field is applied during respective durations of time immediately prior to and immediately after said second high-frequency pulse (HF2) such that integrals of the latter magnetic gradient field over said respective durations have equal absolute values.

8. A method as claimed in claim 2, wherein a magnetic gradient field is applied during respective durations of time immediately prior to and immediately after said fourth high-frequency pulse (HF4) such that integrals of the latter magnetic gradient field over said respective durations have equal absolute values.

9. A method as claimed in claim 7, wherein a magnetic gradient field is applied during respective durations of time immediately prior to and immediately after said fourth high-frequency pulse (HF4) such that integrals of the latter magnetic gradient field over said respective durations have equal absolute values.

10. A method as claimed in claim 3, wherein a magnetic gradient field is applied during respective durations of time immediately prior to and immediately after said second high-frequency pulse (HF2) such that integrals of the latter magnetic gradient field over said respective durations have equal absolute values.

11. A method as claimed in claim 3, wherein a magnetic gradient field is applied during respective durations of time immediately prior to and immediately after said fourth high-frequency pulse (HF4) such that integrals of the latter magnetic gradient field over said respective durations have equal absolute values.

12. A method as claimed in claim 10, wherein a magnetic gradient field is applied during respective durations of time immediately prior to and immediately after said fourth high-frequency pulse (HF4) such that integrals of the latter magnetic gradient field over said respective durations have equal absolute values.

13. An arrangement for two-dimensional magnetic resonance spectroscopy comprising means for producing a homogeneous stationary magnetic field in an examination area, high-frequency coil means for producing high-frequency pulses in, and for receiving magnetic resonance signals from, the examination area, processing means for determining spectra from the received magnetic resonance signals, gradient coil means for producing magnetic gradient fields in said examination area, and control means configured for controlling the high-frequency coil means and the gradient coil means in a manner that a sequence comprising four high-frequency pulses is repeatedly applied to said examination area, said sequence comprising a first high-frequency pulse (HF1), a second 180° high-frequency pulse (HF2) which occurs a first time interval after said first high-frequency pulse (HF1), which first time interval is varied from one repetition of the sequence to another, a third coherence transfer high-frequency pulse (HF3) which occurs a second time interval after the second high-frequency pulse (HF2), said second time interval having a duration (T) less than or equal to a duration ($t_1 + T$) of the first time interval, and a fourth 180° high-frequency pulse (HF4) which occurs a third time interval after the third high-frequency pulse (HF3), said third time interval having a duration (T) which is equal to the duration (T) of the second time interval, wherein three of said four high-frequency pulses are accompanied by different magnetic gradient fields which are applied to said examination area in respective different directions which are mutually perpendicular to each other, and wherein a magnetic gradient field is applied during respective durations of time prior to and after said third high-frequency pulse such that integrals of the latter magnetic gradient field over said respective durations of time have equal absolute values.

14. An arrangement as claimed in claim 13, wherein said arrangement is for demonstrating certain one or more compounds to which protons are bound, and wherein said first high-frequency pulse (HF1) is a frequency-selective pulse unaccompanied by a magnetic gradient field which excites a nuclear magnetization of protons bound to the compounds to be demonstrated without exciting a nuclear magnetization of protons bound to water.

15. An arrangement as claimed in claim 13, wherein said arrangement is for demonstrating certain one or more compounds to which protons are bound, and wherein the three of said four high-frequency pulses accompanied by respective magnetic gradient fields include said first high-frequency pulse (HF1) and said third high-frequency pulse, said sequence further comprises an initial frequency-selective high-frequency pulse which precedes said first high-frequency pulse, said initial high-frequency pulse exciting only a nuclear magnetization of protons bound to water, and for at least a part of an initial time interval between the initial high-frequency pulse (HF0) and said first high-frequency pulse (HF1) a magnetic gradient field is applied for dephasing the excited nuclear magnetization of protons bound to water.

* * * * *